United States Patent
Mochizuki et al.

(10) Patent No.: US 8,201,013 B2
(45) Date of Patent: Jun. 12, 2012

(54) MEMORY CONTROLLER, SYSTEM INCLUDING THE CONTROLLER, AND MEMORY DELAY AMOUNT CONTROL METHOD

(75) Inventors: Hideo Mochizuki, Kanagawa (JP); Kazuaki Masuda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 503 days.

(21) Appl. No.: 12/453,553

(22) Filed: May 14, 2009

(65) Prior Publication Data

US 2009/0292940 A1 Nov. 26, 2009

(30) Foreign Application Priority Data

May 21, 2008 (JP) .................................. 2008-133698

(51) Int. Cl.
*G06F 1/12* (2006.01)
(52) U.S. Cl. ........................................ 713/503; 711/167
(58) Field of Classification Search .................. 713/400, 713/503; 711/167
See application file for complete search history.

(56) References Cited

U.S. PATENT DOCUMENTS

| | | | | |
|---|---|---|---|---|
| 6,334,174 | B1 * | 12/2001 | Delp et al. | 711/167 |
| 7,246,250 | B2 * | 7/2007 | Jung et al. | 713/401 |
| 7,493,461 | B1 * | 2/2009 | Thorne | 711/167 |
| 7,664,978 | B2 * | 2/2010 | Burney et al. | 713/500 |
| 7,697,371 | B2 * | 4/2010 | Chen et al. | 365/233.5 |
| 7,698,589 | B2 * | 4/2010 | Huang | 713/401 |
| 2003/0204763 | A1 * | 10/2003 | Moss et al. | 713/400 |
| 2010/0135100 | A1 * | 6/2010 | Chiu | 365/233.11 |

FOREIGN PATENT DOCUMENTS

JP 2007-12166 1/2007

* cited by examiner

*Primary Examiner* — Glenn A Auve
(74) *Attorney, Agent, or Firm* — McGinn IP Law Group, PLLC

(57) ABSTRACT

A memory controller transmits and receives data to and from a memory. The memory controller includes a delay control section deciding a set value indicative of a determined delay amount in response to a result of a comparison between a test data transmitted to the memory and test data received from the memory, and transmitting the decided set value to the memory, a taking-in section receiving the set value stored in the memory, and a delay adjustment section receiving data from the memory, and arranging a delay amount of the received data in response to the set value received by the taking-in section.

20 Claims, 4 Drawing Sheets

MEMORY CONTROLLER, SYSTEM INCLUDING THE CONTROLLER, AND MEMORY DELAY AMOUNT CONTROL METHOD

INCORPORATION BY REFERENCE

This application is based upon and claims the benefit of the priority from Japanese Patent Application No. 2008-133698 which was filed on May 21, 2008, the disclosure of which is incorporated herein in its entirety by reference.

BACKGROUND OF THE INVENTION

1. Field of the Invention

The present invention relates to a memory controller, a system including the memory controller and a memory delay amount control method.

2. Description of Related Art

In order to write data into an external memory or read data from the external memory, a memory controller for adjusting the amount of delay is required for a system LSI and the like. JP-A-2007-12166 discloses a technique in which delay adjustment of a Double-Data-Rate (DDR) memory is performed by causing the DDR memory to read and write a test pattern prepared in advance.

SUMMARY

However, the present inventors have recognized the following point. Namely, it has been required to turn off the power source of a memory controller in a power-saving mode to reduce power consumption. In the technique described in JP-A-2007-12166, it is necessary to perform delay adjustment of a memory again each time the power source of the memory controller is switched from off, which has been caused by the power-saving mode, to on, and the processing speed decreases. This is because a set value for delay adjustment of the memory is stored inside the memory controller, and it disappears when the power source of the memory controller is turned off by the power-saving mode.

The present invention seeks to solve one or more of the above problems, or to improve upon those problems at least in part.

In one exemplary embodiment, a memory controller according to the present invention transmits and receives data to and from a memory. The memory controller includes a delay control section deciding a set value indicative of a determined delay amount in response to a result of a comparison between a test data transmitted to the memory and test data received from the memory, and transmitting the decided set value to the memory, a taking-in section taking in the set value stored in the memory, and a delay adjustment section receiving data from the memory, and arranging a delay amount of the received data in response to the set value received by the taking-in section from the memory.

In another exemplary embodiment, a system according to the present invention includes a memory, and a memory controller coupled to the memory. The memory controller includes a delay control section deciding a set value indicative of a determined delay amount in response to a result of a comparison between a test data transmitted to the memory and test data returned from the memory, and transmitting the decided set value to the memory, a taking-in section receiving the set value stored in the memory, and a delay adjustment section receiving data from the memory, and arranging a delay amount of the received data in response to the set value received by the taking-in section.

In yet another exemplary embodiment, a memory delay amount control method adjusts a delay amount in transmission and receiving of data to and from a memory. The memory delay amount control method includes comparing test data transmitted to the memory with test data received from the memory, deciding a set value indicative of a determined delay amount in response to a result of comparing, and storing the decided set value in the memory.

According to the present invention, it is possible to provide a high-speed and low-power-consumption memory controller, a memory control system and a memory delay amount control method.

BRIEF DESCRIPTION OF THE DRAWINGS

The above and other purposes, advantages and features of the present invention will become more apparent from the following description of a certain exemplary embodiment taken in conjunction with the accompanying drawings in which:

FIG. 3 is a flowchart in the case where the power source of a system LSI is turned on;

DETAILED DESCRIPTION OF THE EXEMPLARY EMBODIMENTS

The invention will now be described herein with reference to an illustrative exemplary embodiment. Those skilled in the art will recognize that many alternative embodiments can be accomplished using the knowledge of the present invention and that the invention is not limited to the exemplary embodiment illustrated for explanatory purposes.

First Exemplary Embodiment

Figure 1:
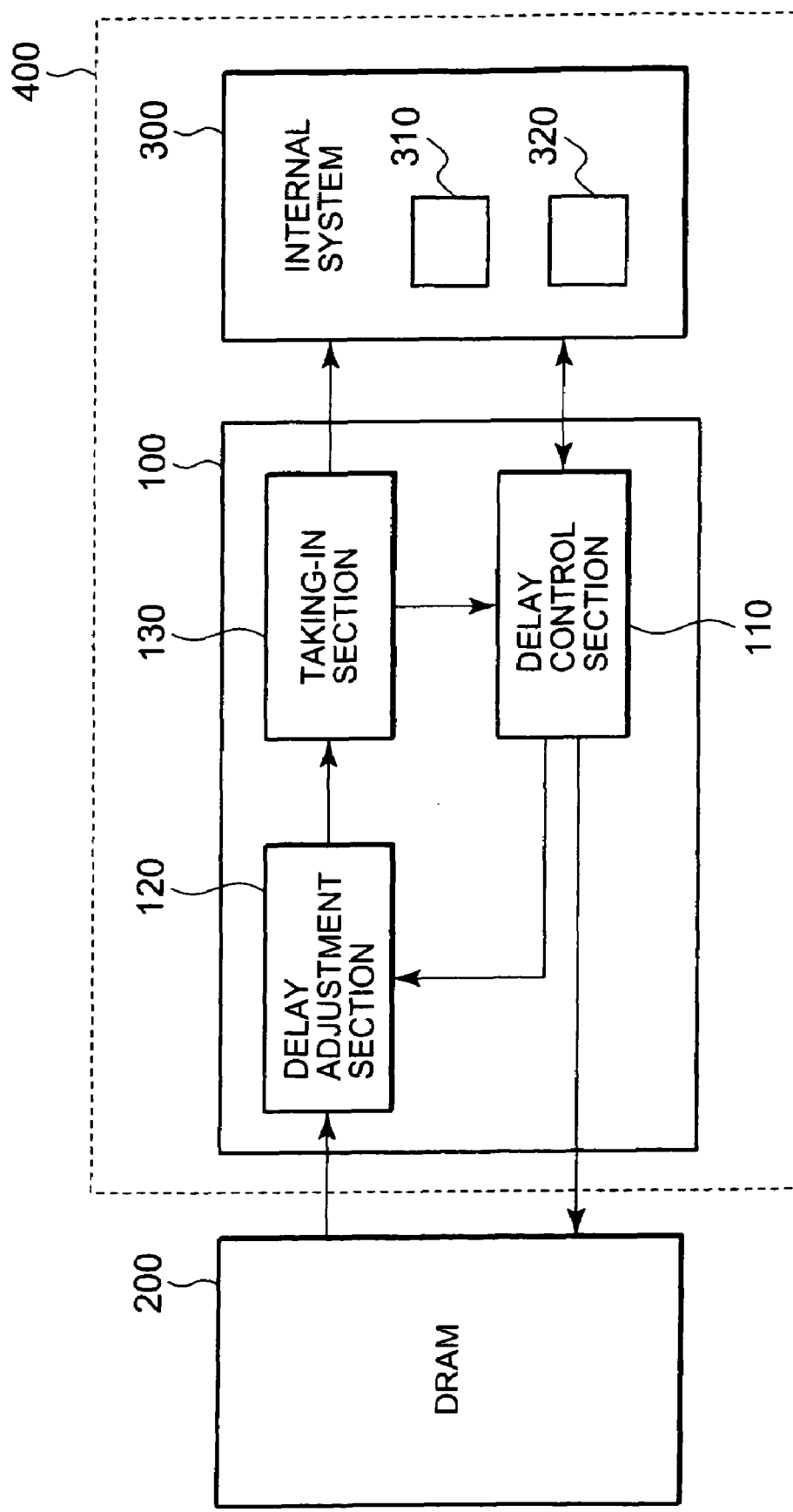
FIG. 1 is a block diagram of a memory control system according to a first exemplary embodiment of the present invention.

The first exemplary embodiment of the present invention will be described below on the basis of drawings. FIG. 1 is a block diagram of a memory control system according to the first exemplary embodiment of the present invention. As shown in FIG. 1, the memory control system according to the first exemplary embodiment is provided with a memory controller 100, a dynamic random access memory (DRAM) 200, which is an external memory, and an internal system 300.

Here, the memory controller 100 and the internal system 300 constitute a system large scale integration (LSI) 400. The internal system 300 is an area outside of the memory controller 100 in the system LSI 400, and it is provided with a central processing unit (CPU) 310, a read only memory (ROM) 320, an input/output (I/O, not shown) port and the like. The memory controller 100 is provided with a delay control section 110, a delay adjustment section 120 and a data taking-in section 130.

The delay control section 110 receives a delay adjustment activation signal and a delay value reading signal from the internal system 300. Data taken in by the data taking-in section 130 is fed back thereto. The delay control section 110 determines a delay set value according to the data fed back and transmits it to the delay adjustment section 120. The delay control section 110 also transmits the delay set value described above, write data, and a command to the DRAM 200. Furthermore, when delay adjustment ends, the delay control section 110 transmits a delay adjustment end signal to the internal system 300.

The delay adjustment section 120 receives data and a clock from the DRAM 200. It also receives the delay set value from the delay control section 110. Then, it adjusts relative delay time and transmits the data and a basic clock to the data taking-in section 130. The delay adjustment of the delay adjustment section 120 is configured, for example, by a combination of delay adjustment by a dynamic link library (DLL) and delay adjustment by a buffer.

The data taking-in section 130 receives the data and the basic clock from the delay adjustment section 120. Then, the data taking-in section 130 transmits them to the internal system 300 as read data from DRAM 200. It also feeds back the taken-in data to the delay control section 110.

The DRAM 200 is an external memory according to the present invention and is, for example, a double-data-rate synchronous dynamic random access memory (DDR SDRAM). The access speed of the DRAM 200 is higher in comparison with the ROM 320 inside the system LSI 400. Therefore, an application program stored in the ROM 320 is transferred to this DRAM 200 after an electronic/electric apparatus body mounted with the memory control system is activated, and used. Furthermore, a nonvolatile memory instead of the ROM may be used.

In this memory control system, it is necessary to turn off the power source of the system LSI 400 in a power-saving mode to reduce power consumption. When the power source of the system LSI 400 is turned off by this power-saving mode, the power source of the DRAM 200 is kept being on. Therefore, it is not necessary to transfer the application program described above to the DRAM 200 from the ROM 320 each time the power source of the system LSI 400 is turned off by this power-saving mode, and a high-speed operation is possible. Here, the DRAM 200 holds data in a self-refresh mode.

In contrast to the conventional method described above, the delay set value determined by the delay control section 110 is also transmitted to and stored in the DRAM 200. As described above, when the power source of the system LSI 400 is turned off by the power-saving mode, the power source of the DRAM 200 is kept on. Therefore, when the power source of the system LSI 400 is switched from off, which has been caused by the power-saving mode, to on, the delay control section 110 can take in the delay set value written in the DRAM 200. That is, in contrast to the conventional method, it is unnecessary to reset the delay set value from the beginning, and thereby a higher-speed operation is possible.

In the first exemplary of the present invention, since the delay set value for the DRAM 200 is stored in the DRAM 200, it is not necessary to add a new memory. Furthermore, by using a DRAM whose unit cost per memory capacity is more inexpensive than a flash memory, cost reduction is possible.

Figure 2:
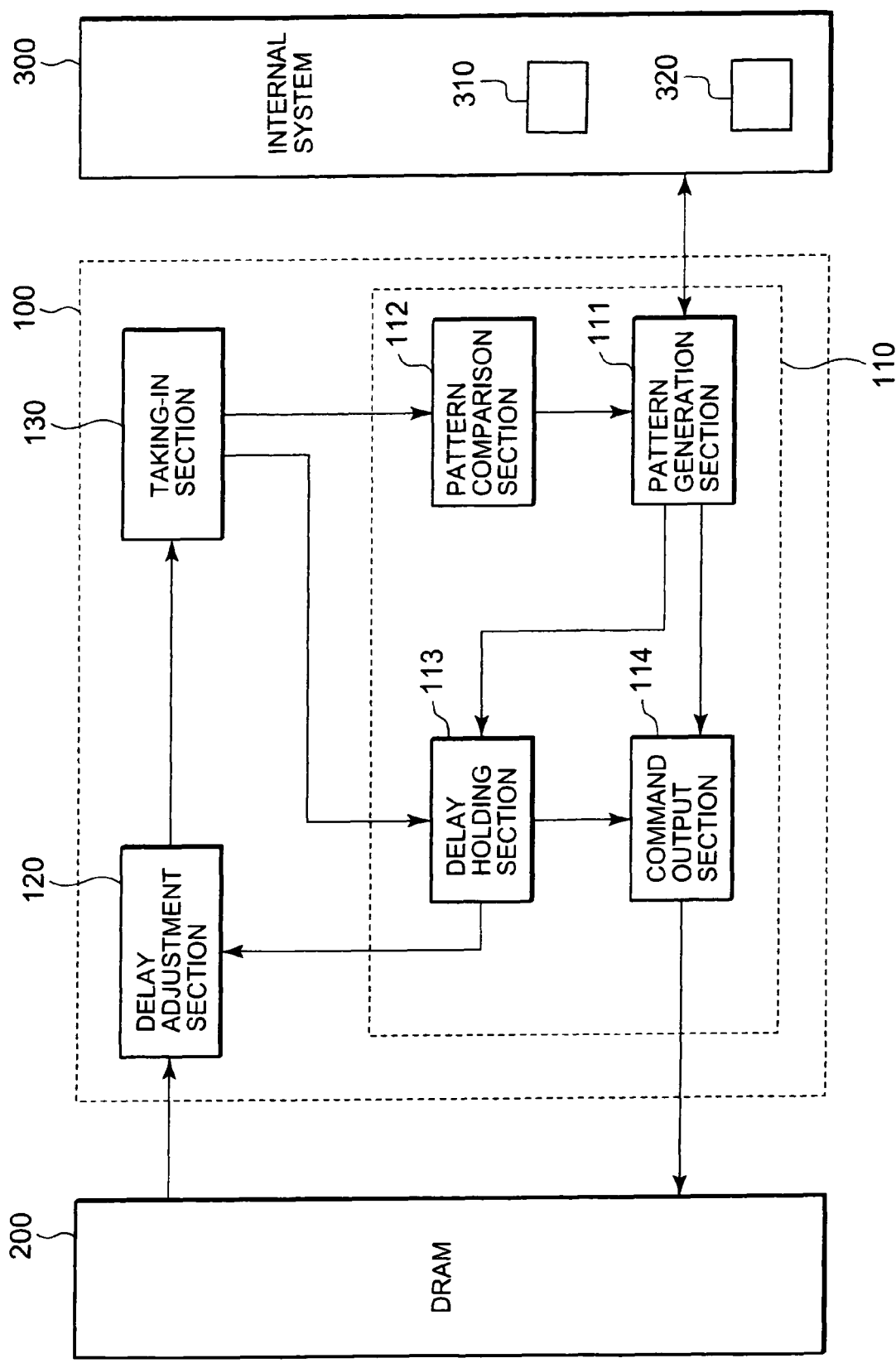
FIG. 2 is a detailed block diagram of the memory control system according to the first exemplary embodiment of the present invention.

Next, a method for determining the delay set value will be described in detail with the use of FIG. 2. FIG. 2 is a detailed block diagram of the memory control system according to the first exemplary embodiment of the present invention. As shown in FIG. 2, the delay control section 110 is provided with a pattern generation section 111, a pattern comparison section 112, a delay holding section 113, and a command output section 114.

Next, the method for determining the delay set value will be described in detail. In an initial state, that is, at the time when the electronic/electric apparatus body mounted with the memory control system is activated, the delay set value held by the delay holding section 113 is an initial value determined appropriately.

First, when receiving a delay adjustment activation signal from the internal system 300, the pattern generation section 111 transmits a test pattern to the command output section 114 and a delay value output instruction to the delay holding section 113. In response to this, the command output section 114 writes the test pattern into the DRAM 200. The delay holding section 113 transmits the delay set value to the delay adjustment section 120.

Next, the pattern generation section 111 transmits a data reading signal to the command output section 114 to check whether or not the test pattern could be written into the DRAM 200. In response to this, the command output section 114 transmits a reading-out request to the DRAM 200.

The read data is transmitted to the data taking-in section 130 from the DRAM 200 via the delay adjustment section 120. The pattern comparison section 112 compares the test pattern and the read data to judge whether or not the test pattern has been read as expected. The comparison result is fed back to the pattern generation section 111. The pattern generation section 111 generates a test pattern according to the comparison result. The pattern generation section 111 also transmits a delay set value corresponding to the test pattern to the delay holding section 113.

The above described feed back operation is repeated, and the pattern generation section 111 determines an appropriate delay set value. For example, verification is performed by gradually changing the amount of delay among eight stages of delays 1 to 8. As a result, if reading of the data is successful consecutive three times with the delays 3, 4 and 5, the delay 4 is judged to be the optimum.

Next, if judging that the delay set value in the delay holding section 113 is appropriate, the pattern generation section 111 transmits a command for writing the delay set value into the DRAM 200, to the command output section 114. In response to this, the command output section 114 receives the delay set value from the delay holding section 113 and transmits it to the DRAM 200.

Next, the pattern generation section 111 transmits a delay adjustment end signal to the internal system 300. After that, turning-off of the power source of the system LSI 400 by the power-saving mode is enabled. As described above, when the power source of the system LSI 400 is turned off by the power-saving mode, the power source of the DRAM 200 is kept on. Therefore, when the power source of the system LSI 400 is switched from off, which has been caused by the power-saving mode, to on, the pattern generation section 111 receives a delay value reading signal from the internal system 300 and transmits a delay set value reading signal to the command output section 114.

The command output section 114 transmits a delay set value reading-out request to the DRAM 200. The delay set value is transmitted to the data taking-in section 130 from the DRAM 200 via the delay adjustment section 120. Then, the delay set value is transmitted to the delay holding section 113 from the data taking-in section 130. Thereby, it is unnecessary to reset the delay set value from the beginning, and thereby a higher-speed operation is possible.

Figure 3:
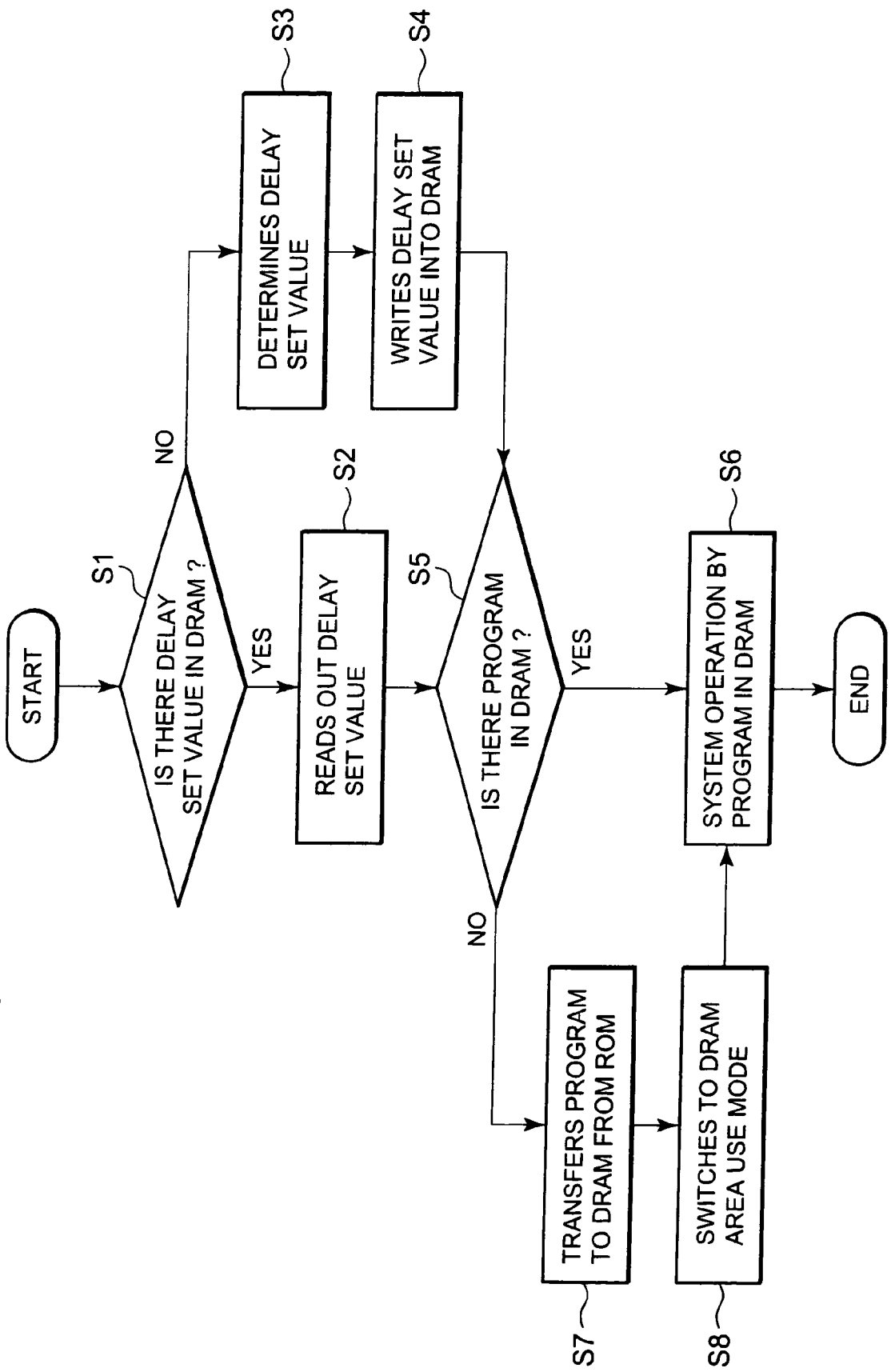

Next, a flowchart in the case where the power source of the system LSI 400 is turned on will be described with the use of FIG. 3. First, it is judged whether or not there is a delay set value in the DRAM 200 (S1). If there is a delay set value in the DRAM 200 (S1: YES), the delay set value is read out (S2). On the other hand, if there is not a delay set value in the DRAM 200 (S1: NO), the delay control section 110 determines a delay set value by the feed back operation (S3) as described above, and writes the delay set value into the DRAM 200 (S4).

Next, it is judged whether or not there is a program in the DRAM 200 (S5). If there is a program in the DRAM 200 (S5: YES), a system operation is performed by the program on the DRAM 200 (S6). On the other hand, if there is not a program in the DRAM 200 (S5: NO), a program is transferred to the DRAM 200 from the ROM 320 (S7), and the mode is switched to a mode for using a DRAM area. Then, a system operation is performed by the program on the DRAM 200 (S6).

As described above, in the memory control system according to the first exemplary embodiment of the present invention, a delay set value determined by the delay control section 110 is transmitted to and stored in the DRAM 200. When the power source of the system LSI 400 is turned off by the power-saving mode, the power source of the DRAM 200 is kept on. Therefore, when the power source of the system LSI 400 is switched from off, which has been caused by the power-saving mode, to on, the delay control section 110 can take in the delay set value written in the DRAM 200. That is, it is unnecessary to reset the delay set value from the beginning, and thereby a higher-speed operation is possible. Thus, it is possible to provide a high-speed and low-power-consumption memory controller, a memory control system and a memory delay amount control method.

Furthermore, in the first exemplary of the present invention, since the delay set value for the DRAM 200 is stored in the DRAM 200, it is not necessary to add a new memory. Furthermore, by using a DRAM whose unit cost per memory capacity is more inexpensive than a flash memory, cost reduction is possible.

Figure 4:
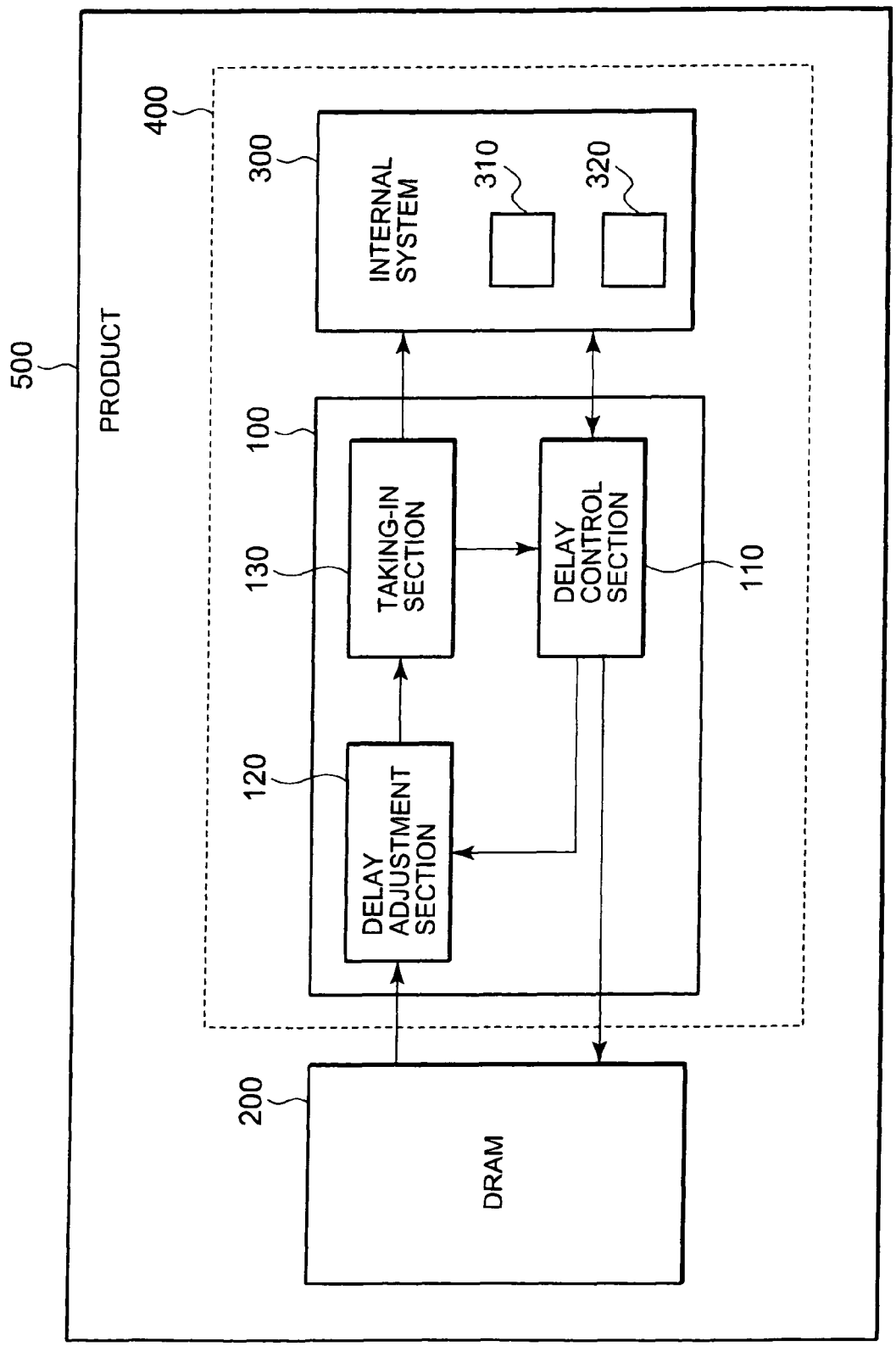
FIG. 4 is a diagram showing an example of installing in a product.

Furthermore, as shown in FIG. 4, the memory controller and the system including the memory controller may be installed in various products (a product 500 in FIG. 4), for example, home electric appliances, vehicles with great benefit.

Although the invention has been described above in connection with the exemplary embodiment thereof, it will be appreciated by those skilled in the art that this exemplary embodiment is provided solely for illustrating the invention, and should not be relied upon to construe the appended claims in a limiting sense.

Further, it is noted that, notwithstanding any claim amendments made hereafter, applicants' intent is to encompass equivalents all claim elements, even if amended later during prosecution.

What is claimed is:

1. A memory controller transmitting and receiving data to and from an external memory in an external region of a system large scale integration (LSI) including the memory controller, the memory controller comprising:
    a delay control section including a delay holding section, coupled to an external terminal of the system LSI and deciding a set value indicative of a determined delay amount based on a result of a comparison between a test data transmitted to the external memory and test data received from the external memory to output the set value from the external terminal to the external memory in the external region of the system LSI;
    a taking-in section receiving the set value in the external memory; and
    a delay adjustment section receiving data from the external memory, and arranging a delay amount of the received data in response to the set value received by the taking-in section,
    wherein the set value is stored in both the delay holding section of the memory controller and the external memory in the external region of the system LSI including the memory controller.

2. The memory controller according to claim 1, wherein the external memory comprises a dynamic random access memory (DRAM).

3. The memory controller according to claim 1, wherein the data from the external memory comprises a clock, and wherein the delay adjustment section arranges a delay amount of a received clock in response to the set value received by the taking-in section.

4. The memory controller according to claim 1, wherein the delay control section comprises:
    a pattern generation section generating the test data; and
    a command output section coupled to the delay holding section to read the set value from the delay holding section and to output the set value from the external terminal to the external memory, and transmitting a write command to store the test data and the set value to the memory.

5. The memory controller according to claim 4, wherein the pattern generation section couples to an internal system including a central processing unit (CPU) and a read only memory (ROM), and generates the test data in response to a signal from the internal system.

6. The memory controller according to claim 4, wherein the pattern generation section couples to an internal system including a central processing unit (CPU) and a nonvolatile memory, and generates the test data in response to a signal from the internal system.

7. The memory controller according to claim 1, wherein the delay control section generates a plurality of test set values indicative of a test delay amount to receive the plurality of test data with a different delay amount from the external memory when the set value is decided, and
    wherein the delay adjustment section arranges a delay amount of the plurality of test data returned from the external memory in response to the plurality of test set values.

8. The memory controller according to claim 7, wherein the delay control section comprises:
    a pattern comparison section comparing the plurality of test data with the different delay amounts returned from the external memory with the test data transmitted to the external memory.

9. The memory controller according to claim 1, wherein the external memory is maintained with a power supply supplied when the memory controller operates in a power saving mode to be turned off.

10. A product comprising the memory controller according to claim 1.

11. The memory controller according to claim 1, wherein the external memory holds data in a self-refresh mode.

12. A system comprising:
    an external memory in an external region of a system large scale integration (LSI);
    a memory controller included in the system LSI and coupled to the external memory,
    wherein the memory controller comprises:
        a delay control section including a delay holding section coupled to an external terminal of the system LSI and deciding a set value indicative of a determined delay amount based on a result of a comparison between a test data transmitted to the memory and test data received from the external memory to output the set value from the external terminal to the external memory in the external region of the system LSI;

a taking-in section receiving the set value in the external memory; and a delay adjustment section receiving data from the external memory, and arranging a delay amount of the received data in response to the set value received by the taking-in section, wherein the set value is stored in both the delay holding section of the memory controller and the external memory in the external region of the system LSI including the memory controller.

13. The system according to claim 12, further comprising:
an internal system coupled to the memory controller,
wherein the internal system comprises a central processing unit (CPU) and a read only memory (ROM), and
wherein the delay control section generates the test data in response to a signal from the internal system.

14. The system according to claim 12, further comprising:
an internal system coupled to the memory controller,
wherein the internal system comprises a central processing unit (CPU) and a nonvolatile memory, and
wherein the delay control section generates the test data in response to a signal from the internal system.

15. The system according to claim 12, wherein the external memory is maintained with power supply supplied when the memory controller operates in a power saving mode to be turned off.

16. The system according to claim 15, wherein the memory controller receives the set value from the external memory when the memory controller returns from the power saving mode.

17. The system according to claim 12, wherein the external memory comprises a dynamic random access memory (DRAM).

18. A memory delay amount control method for adjusting a delay amount in transmission and receiving of data to and from a memory, the memory delay amount control method comprising:

comparing test data transmitted to the memory with test data received from the memory;

deciding a set value indicative of a determined delay amount in response to a result of said comparing; and storing the decided set value in the memory, wherein the memory is maintained with power supply supplied when the memory controller operates in a power saving mode to be turned off.

19. The memory delay amount control method according to claim 18, wherein the memory controller receives the set value from the memory when the memory controller returns from the power saving mode.

20. The memory delay amount control method according to claim 18, wherein the memory comprises a dynamic random access memory (DRAM).

* * * * *